(12) United States Patent
Kuan et al.

(10) Patent No.: US 10,593,637 B2
(45) Date of Patent: Mar. 17, 2020

(54) MULTI-DEVICE PACKAGES AND RELATED MICROELECTRONIC DEVICES

(71) Applicant: Micron Technology, Inc., Boise, ID (US)

(72) Inventors: Shih-Fan Kuan, Taoyuan (TW); Yi-Jen Lo, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/108,473

(22) Filed: Aug. 22, 2018

(65) Prior Publication Data

US 2018/0358315 A1 Dec. 13, 2018

Related U.S. Application Data

(62) Division of application No. 14/731,382, filed on Jun. 4, 2015, now Pat. No. 10,373,922.

(51) Int. Cl.
*H01L 23/04* (2006.01)
*H01L 23/00* (2006.01)
(Continued)

(52) U.S. Cl.
CPC .......... *H01L 24/09* (2013.01); *H01L 21/4846* (2013.01); *H01L 21/76877* (2013.01); *H01L 21/82* (2013.01); *H01L 23/3114* (2013.01); *H01L 23/5384* (2013.01); *H01L 23/5389* (2013.01); *H01L 24/17* (2013.01); *H01L 23/49816* (2013.01); *H01L 23/525* (2013.01); *H01L 2224/0231* (2013.01); *H01L 2224/0237* (2013.01); *H01L 2224/04105* (2013.01);
(Continued)

(58) Field of Classification Search
CPC ................. H01L 21/82; H01L 21/4846; H01L 21/76877; H01L 23/3114; H01L 23/5389; H01L 23/5384; H01L 24/17; H01L 24/09
USPC ........................................................ 257/698
See application file for complete search history.

(56) References Cited

U.S. PATENT DOCUMENTS 6,222,212 B1   4/2001  Lee et al.
8,039,304 B2 * 10/2011  Pagaila ................. H01L 21/561
                                                  438/107

(Continued)

FOREIGN PATENT DOCUMENTS

| CN | 103000619 A | 3/2013 |
| CN | 103270588 A | 8/2013 |
| JP | 2008-166824 A | 7/2008 |
| TW | 201114009 A | 4/2011 |
| TW | I482257 B | 4/2015 |

OTHER PUBLICATIONS

Chinese Office Action and Search Report from Chinese Application No. 201510534702.2, dated Apr. 17, 2018, 16 pages with English translation.

*Primary Examiner* — Luan C Thai
(74) *Attorney, Agent, or Firm* — TraskBritt

(57) ABSTRACT

A multi-device package includes a substrate, at least two device regions, a first redistribution layer, an external chip and a plurality of first connectors. The two device regions are formed from the substrate, and the first redistribution layer is disposed on the substrate and electrically connected to the two device regions. The external chip is disposed on the first redistribution layer, and the first connectors are interposed between the first redistribution layer and the external chip to interconnect the two.

22 Claims, 17 Drawing Sheets

(51) Int. Cl.
*H01L 23/538* (2006.01)
*H01L 21/82* (2006.01)
*H01L 21/768* (2006.01)
*H01L 21/48* (2006.01)
*H01L 23/31* (2006.01)
*H01L 23/498* (2006.01)
*H01L 23/525* (2006.01)

(52) U.S. Cl.
CPC . *H01L 2224/11* (2013.01); *H01L 2224/12105* (2013.01); *H01L 2224/13024* (2013.01); *H01L 2224/13111* (2013.01); *H01L 2224/16145* (2013.01); *H01L 2224/1703* (2013.01); *H01L 2224/73209* (2013.01); *H01L 2224/81* (2013.01); *H01L 2224/9202* (2013.01); *H01L 2224/94* (2013.01); *H01L 2224/97* (2013.01); *H01L 2924/014* (2013.01)

(56) References Cited

U.S. PATENT DOCUMENTS

| | | | |
|---|---|---|---|
| 8,304,896 B2 | 11/2012 | England | |
| 8,860,229 B1 | 10/2014 | Lin | |
| 9,087,821 B2 * | 7/2015 | Lin | H01L 23/481 |
| 9,412,661 B2 * | 8/2016 | Lu | H01L 21/561 |
| 2004/0212030 A1 | 10/2004 | Asai | |
| 2008/0316714 A1 | 12/2008 | Eichelberger et al. | |
| 2009/0077796 A1 | 3/2009 | Sakamoto et al. | |
| 2011/0037169 A1 | 2/2011 | Pagaila | |
| 2011/0057327 A1 | 3/2011 | Yoshida et al. | |
| 2011/0084382 A1 | 4/2011 | Chen et al. | |
| 2013/0056871 A1 | 3/2013 | Yu et al. | |
| 2013/0105991 A1 | 5/2013 | Gan et al. | |
| 2015/0108653 A1 | 4/2015 | Hooper et al. | |
| 2015/0162265 A1 | 6/2015 | Jo et al. | |

\* cited by examiner

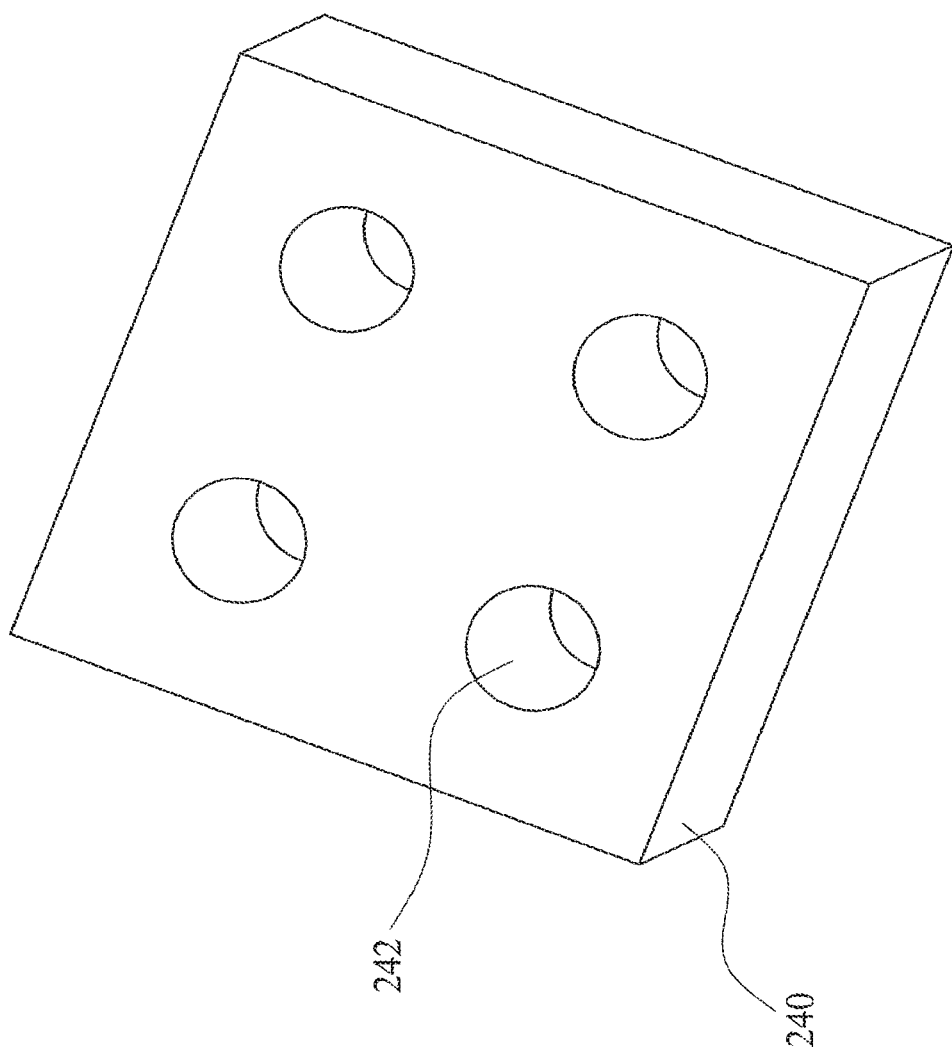

MULTI-DEVICE PACKAGES AND RELATED MICROELECTRONIC DEVICES

CROSS-REFERENCE TO RELATED APPLICATION

This application is a divisional of U.S. patent application Ser. No. 14/731,382, filed Jun. 4, 2015, now U.S. Pat. No. 10,373,922, issued Aug. 6, 2019, the disclosure of which is hereby incorporated herein in its entirety by this reference.

BACKGROUND

Along with the evolution in the manufacturing technology of semiconductor devices, the functional density of the semiconductor devices has increased with the decrease of device sizes to achieve higher integration density of the semiconductor devices. As a result, demands to packaging technology are becoming severe under conditions of decreases in size and increases in density of the semiconductor devices. In recent years, the demands to the smaller electronic devices have increased, and innovative packaging technology is required.

Generally, several devices are fabricated in a wafer, and a dicing process is performed to separate these devices into individual chips. These chips are placed on a carrier substrate, and a packaging process is performed to integrate multiple chips into one package. However, these chips suffer vibration when being placed on the carrier substrate, and problems of disconnection and fracture may easily occur to the chips, which decreases the yield of the package. In addition, extra costs for the carrier substrate further decrease efficiency of the packaging process. Therefore, a novel packaging structure and a manufacturing process thereof are necessary to solve problems mentioned above.

BRIEF SUMMARY

The present disclosure provides a multi-device package. The multi-device package includes a substrate, at least two device regions, a first redistribution layer, an external chip and a plurality of first connectors. The two device regions are formed from the substrate, and the first redistribution layer is disposed on the substrate and electrically connected to the two device regions. The external chip is disposed on the first redistribution layer, and the first connectors are interposed between the first redistribution layer and the external chip to interconnect the two.

In various embodiments of the present disclosure, the multi-device package further includes a plurality of second connectors disposed on the first redistribution layer.

In various embodiments of the present disclosure, a diameter of the second connector is larger than a sum of a diameter of the first connector and a thickness of the external chip.

In various embodiments of the present disclosure, the multi-device package further includes a molding layer, a second redistribution layer, and a plurality of third connectors. The molding layer covers the external chip and the first redistribution layer, and the second redistribution layer is disposed on the molding layer. The third connectors are disposed on the second redistribution layer.

In various embodiments of the present disclosure, the molding layer includes a first conductive contact through the molding layer to interconnect the first redistribution layer and the second redistribution layer.

In various embodiments of the present disclosure, the molding layer includes a second conductive contact through the molding layer and the external chip to interconnect the first redistribution layer and the second redistribution layer.

In various embodiments of the present disclosure, each of the first redistribution layer and the second redistribution layer includes a plurality of metal layers arranged in parallel inside a dielectric layer, and a plurality of vias, which two adjacent metal layers are electrically connected by the via.

In various embodiments of the present disclosure, the molding layer includes epoxy.

The present disclosure provides a multi-device package. The multi-device package includes a substrate, at least two device regions, a first redistribution layer, an external chip, a second redistribution layer and a molding layer. The two device regions are disposed in the substrate, and the first redistribution layer is disposed on the substrate. The external chip is disposed on the first redistribution layer, and the second redistribution layer is disposed on the first redistribution layer. The molding layer is interposed between the first redistribution layer and the second redistribution layer, which molding layer includes a first conductive contact and a second conductive contact. The first conductive contact is through the molding layer, and the second conductive contact is through the molding layer and the external chip, which first conductive contact and the second conductive contact interconnect the first redistribution layer and the second redistribution layer.

The present disclosure provides a process of manufacturing a multi-device package, and the process includes the following steps. A first redistribution layer is formed on a wafer having at least two device regions, and the first redistribution layer is electrically connected to the two device regions. A plurality of first connectors is formed on the first redistribution layer, and an external chip is mounted on the first connectors, which external chip is electrically connected to the first redistribution layer by the first connectors.

In various embodiments of the present disclosure, the process further includes the following steps. A plurality of second connectors is formed on the first redistribution layer, and a diameter of the second connector is larger than a sum of a diameter of the first connector and a thickness of the external chip.

In various embodiments of the present disclosure, the process further includes the following steps. A temporary adhesive layer is formed to cover the second connectors and the external chip, and the wafer is thinned. Then, the temporary adhesive layer is removed.

In various embodiments of the present disclosure, the process further includes the following steps. The wafer is diced along a scribe line to form the multi-device package.

In various embodiments of the present disclosure, the external chip has a first through hole.

In various embodiments of the present disclosure, the process further includes the following steps. A molding layer is formed to cover the first redistribution layer and the external chip, and a portion of the molding layer is removed to form a second through hole and a third through hole, which second through hole exposes the first distribution layer, and the third through hole is through the first through hole to expose the first redistribution layer. Then, a conductive material is filled in the first through hole, the second through hole and the third through hole to form a first conductive contact and a second conductive contact.

In various embodiments of the present disclosure, the process further includes the following steps. A second redistribution layer is formed on the molding layer, which second redistribution layer is electrically connected to the first conductive contact and the second conductive contact. Then, a plurality of third connectors is formed on the second redistribution layer.

In various embodiments of the present disclosure, the process further includes the following steps. A temporary adhesive layer is formed to cover the third connectors and the second redistribution layer, and the wafer is thinned. Then, the temporary adhesive layer is removed.

In various embodiments of the present disclosure, the process further includes the following steps. The wafer is diced along a scribe line to form the multi-device package.

In various embodiments of the present disclosure, the first redistribution layer is formed on the wafer by the following steps. A dielectric material is deposited to cover the wafer, and a portion of the dielectric material is removed to form openings exposing device regions of the wafer. Vias are formed in the openings, and a metal layer is formed on the vias. Then, the metal layer is patterned.

In various embodiments of the present disclosure, the second redistribution layer is formed on the molding layer by the following steps. A dielectric material is deposited to cover the molding layer, and a portion of the dielectric material is removed to form openings exposing the first conductive contact and the second conductive contact. Vias are formed in the openings, and a metal layer is formed on the vias. Then, the metal layer is patterned.

BRIEF DESCRIPTION OF THE DRAWINGS

The disclosure may be more fully understood by reading the following detailed description of the embodiments, with reference made to the accompanying drawings as follows:

FIG. 2C is a three-dimensional view of an external chip, according to various embodiments of the present disclosure;

DETAILED DESCRIPTION

Figure 1A:
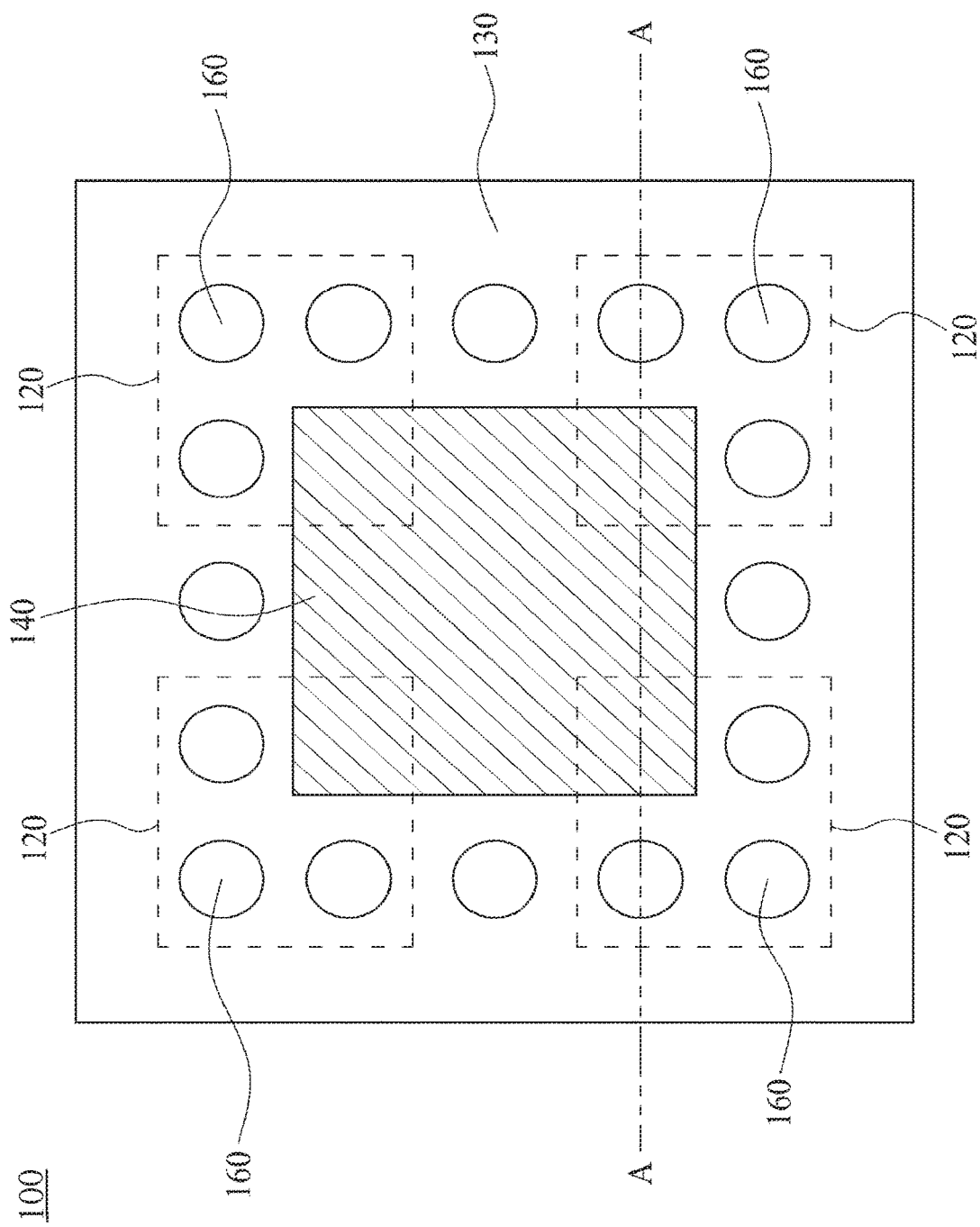
FIG. 1A is a top view of a multi-device package according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1B:
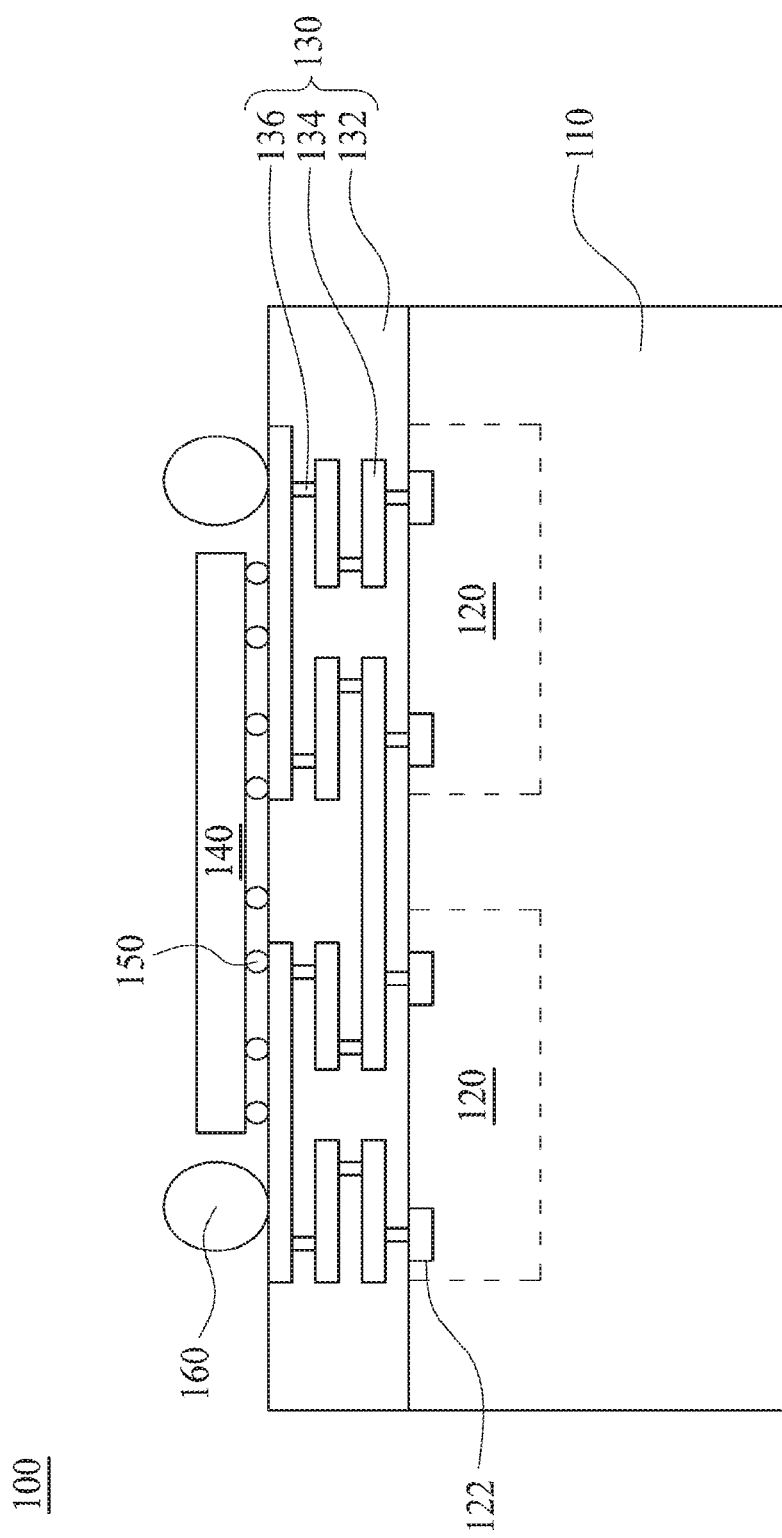
FIG. 1B is a cross-sectional view of a multi-device package in FIG. 1A along the line AA, according to various embodiments of the present disclosure.

Please refer to FIG. 1A and FIG. 1B. FIG. 1A is a top view of a multi-device package according to various embodiments of the present disclosure, and FIG. 1B is a cross-sectional view of the multi-device package in FIG. 1A along the line AA, according to various embodiments of the present disclosure. As shown in FIG. 1A and FIG. 1B, a multi-device package 100 includes a substrate 110, at least two device regions 120, a first redistribution layer 130, an external chip 140, a plurality of first connectors 150 and a plurality of second connectors 160.

These device regions 120 are formed from the substrate 110, so there is no interface between the device regions 120 and the substrate 110. Generally, a wafer is diced to separate device regions into individual chips. These chips are placed on a carrier substrate, and an interface is formed between the carrier substrate and the chips. Then, a packaging process is performed to integrate multiple chips into one package. However, these chips suffer vibration when being placed on the carrier substrate, and problems of disconnection and fracture may easily occur on the chips, which decrease the yield of the package. In addition, extra costs for the carrier substrate further decreases efficiency of the packaging process. Relatively, the multi-device package 100 of the present disclosure is manufactured by a wafer-level packaging process, which means all the devices are packaged and tested after completion of manufacturing the device regions 120 in the wafer, and then the wafer is diced into the multi-device package 100 shown in FIGS. 1A and 1B. It is worth noting that the device regions 120 in the wafer are integrated directly before dicing to omit the usage of a carrier substrate, so that the device regions 120 and the substrate 110 have no interface therebetween.

Each of the device regions 120 includes a semiconductor device, an inter-layer dielectric (ILD) layer covering the semiconductor device, a inter-metal dielectric (IMD) layer on the ILD layer, and a metal interconnect structure disposed in the 1 MB layer and electrically connected to the semiconductor device. In addition, the device region 120 has a conductive pad 122, which is an uppermost metal layer of the metal interconnect structure. In some embodiments, the substrate 110 is formed from a wafer including silicon, germanium, or other III-V group elements, but is not limited thereto. In various embodiments, the semiconductor device is a memory device, but is not limited thereto. Other semiconductor devices are also suitable in the present disclosure.

Continuing in FIG. 1B, the first redistribution layer 130 is disposed on the substrate 110 and electrically connected to at least two device regions 120. The first redistribution layer 130 is in contact with the conductive pads 122 of the device regions 120, and therefore the device regions 120 are electrically connected to each other by the first redistribution layer 130. Referring back to FIG. 1A, the multi-device package 100 illustrated in FIG. 1A has four device regions 120 therein, and the first redistribution layer 130 electrically connects these four device regions 120. For example, the semiconductor device may be a memory device, and each of the device regions 120 provides a storage capacity of 2 gigabytes. The first redistribution layer 130 integrates these four device regions 120 to achieve a storage capacity of 8 gigabytes, but is not limited thereto.

Furthermore, the first redistribution layer 130 is applied to redistribute or relocate the signals to an arrangement of external devices or input/output connections. The first redistribution layer 130 includes a dielectric layer 132, a plurality of metal layers 134 and a plurality of vias 136. The metal layers 134 are arranged in parallel inside the dielectric layer 132, and the vias 136 are also in the dielectric layer 132, which two adjacent metal layers 134 are electrically connected by the vias 136. Notably, the metal layers 134 are electrically connected to the conductive pads 122 of the device regions 120 by the vias 136, so as to electrically connect at least two device regions 120 through the conductive pads 122, the vias 136 and the metal layers 134. In addition, the number of the metal layers 134 is predetermined according to design requirement. In some embodiments, the vias 136 and the metal layers 134 are formed of aluminum, copper, or a combination thereof, but are not limited thereto. Other conductive materials are also suitable for the vias 136 and the metal layers 134. In various embodiments, the dielectric layer 132 is formed of silicon oxide, silicon nitride, silicon oxynitride, or a combination thereof, but is not limited thereto. Other insulating materials are also suitable for the dielectric layer 132.

Continuing in FIGS. 1A and 1B, the external chip 140 is disposed on the first redistribution layer 130, and a plurality of first connectors 150 are interposed between the first redistribution layer 130 and the external chip 140 to interconnect the two. As aforementioned, the first redistribution layer 130 is electrically connected to at least two device regions 120, and the first connectors 150 are disposed on and in contact with the first redistribution layer 130. The external chip 140 is disposed on and in contact with the first connectors 150, so that the external chip 140 is electrically connected to the device regions 120 via the first connectors 150, the first redistribution layer 130 and the conductive pads 122. Therefore, the external chip 140 is able to receive signals from the device regions 120 to perform computing operations.

Continuing in FIGS. 1A and 1B, a plurality of second connectors 160 are disposed on the first redistribution layer 130. As shown in FIG. 1A, the second connectors 160 surround the external chip 140. The second connectors 160 are disposed on and in contact with the first redistribution layer 130, so that computing results generated by the external chip 140 are transmitted to the second connectors 160. The second connectors 160 further transmit computing results to other external devices, such as a printed circuit board. In some embodiments, a diameter of the second connector 160 is larger than a sum of a diameter of the first connector 150 and a thickness of the external chip 140. Therefore, the external chip 140 is not in contact with the subsequent printed circuit board to avoid connection errors. In some embodiments, the first connectors 150 and the second connectors 160 may be solder bumps or solder balls formed of tin, but are not limited thereto.

Figure 2A:
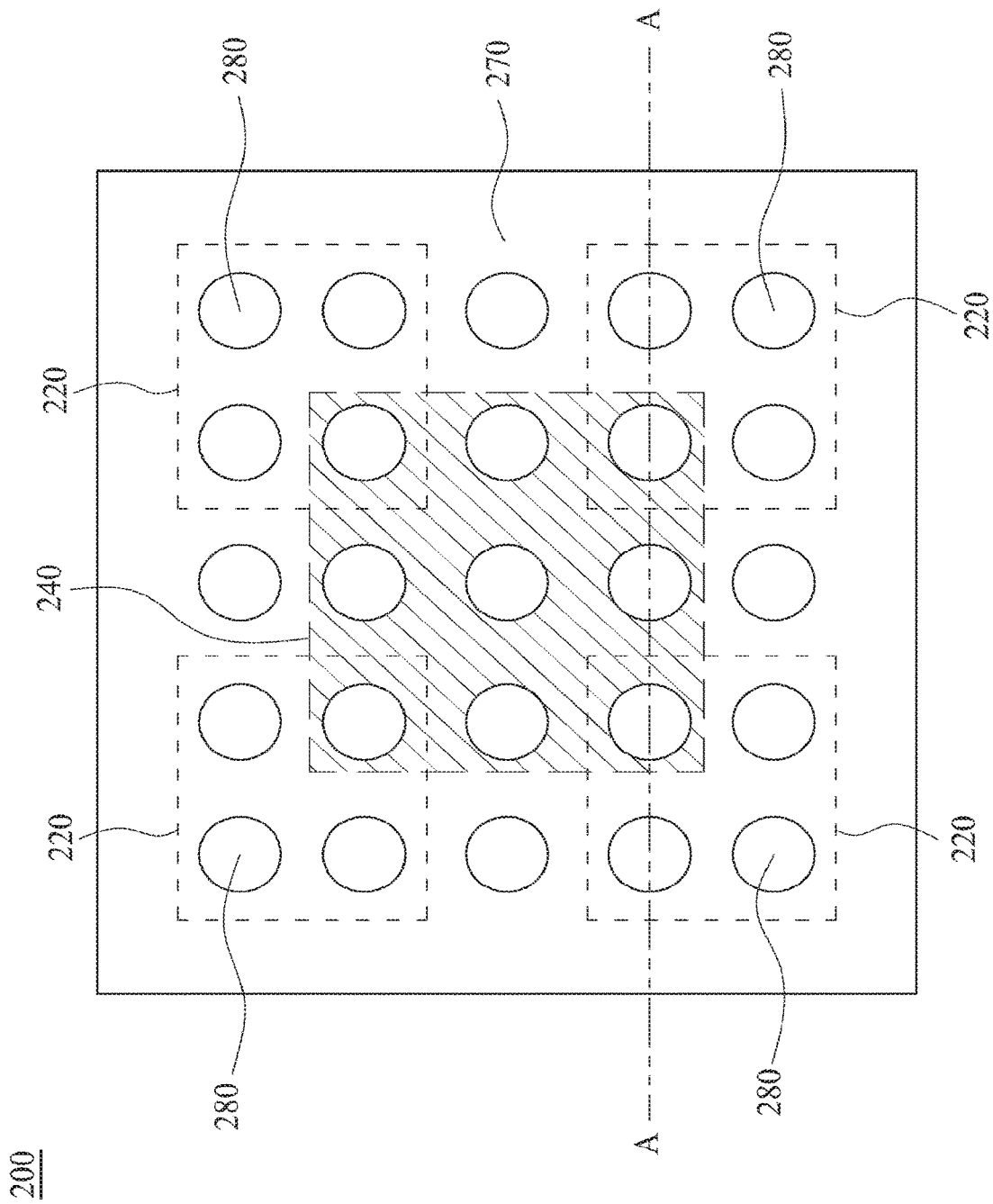
FIG. 2A is a top view of a multi-device package according to various embodiments of the present disclosure.
Figure 2B:
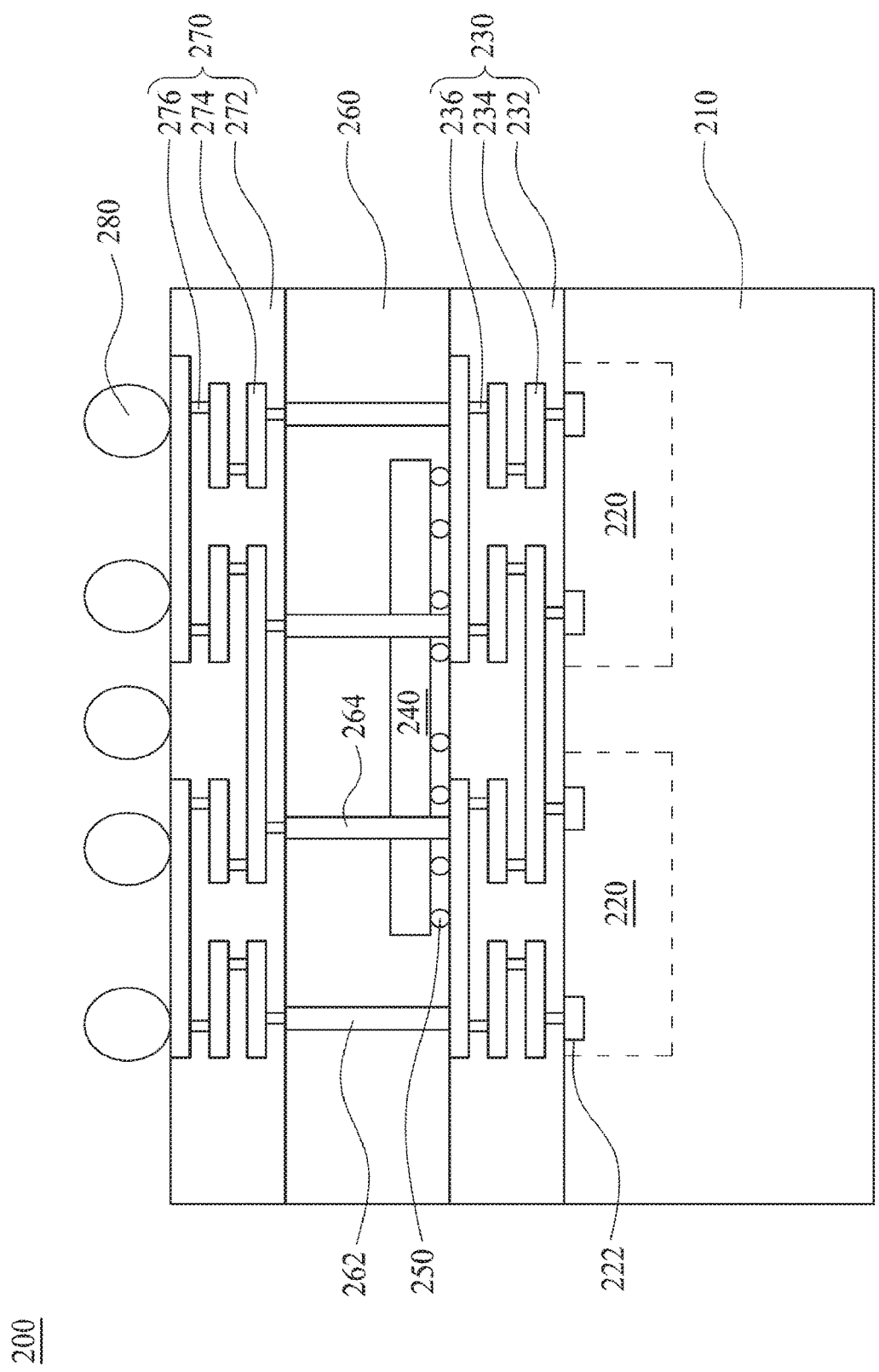
FIG. 2B is a cross-sectional view of a multi-device package in FIG. 2A along the line AA, according to various embodiments of the present disclosure.

Referring to FIG. 2A and FIG. 2B, FIG. 2A is a top view of a multi-device package according to various embodiments of the present disclosure, and FIG. 2B is a cross-sectional view of the multi-device package in FIG. 2A along the line AA, according to various embodiments of the present disclosure. As shown in FIG. 2A and FIG. 2B, a multi-device package 200 includes a substrate 210, at least two device regions 220, a first redistribution layer 230, an external chip 240, a plurality of first connectors 250, a molding layer 260, a second redistribution layer 270 and a plurality of third connectors 280.

The device regions 220 are formed from the substrate 210, so there is no interface between the device regions 220 and the substrate 210. The multi-device package 200 of the present disclosure is also manufactured by a wafer-level packaging process, which means all the devices are packaged and tested after completion of manufacturing the device regions 220 in the wafer, and then the wafer is diced into the multi-device package 200 shown in FIGS. 2A and 2B. It is worth noting that the device regions 220 in the wafer are integrated directly before dicing to omit the usage of a carrier substrate, so that the device regions 220 and the substrate 210 have no interface therebetween. Each of the device regions 220 includes a semiconductor device, an inter-layer dielectric (ILD) layer covering the semiconductor device, an inter-metal dielectric (IMD) layer on the ILD layer, and a metal interconnect structure disposed in the 1 MB layer and electrically connected to the semiconductor device. In addition, the device region 220 has a conductive pad 222, which is the uppermost metal layer of the metal interconnect structure.

In some embodiments, the substrate 210 is formed from a wafer including silicon, germanium, or other III-V group elements, but is not limited thereto. In various embodiments, the semiconductor device is a memory device, but is not limited thereto. Other semiconductor devices are also suitable in the present disclosure.

Continuing in FIG. 2B, the first redistribution layer 230 is disposed on the substrate 210 and electrically connected to at least two device regions 220. The first redistribution layer 230 is in contact with the conductive pads 222 of the device regions 220, and therefore the device regions 220 are electrically connected to each other via the first redistribution layer 230. Referring back to FIG. 2A, the multi-device package 200 illustrated in FIG. 2A has four device regions 220 therein, and the first redistribution layer 230 connects these four device regions 220. For example, the semiconductor device may be a memory device, and each of the device regions 220 provides a storage capacity of 2 gigabytes. The first redistribution layer 230 integrates these four device regions 220 to achieve a storage capacity of 8 gigabytes, but is not limited thereto.

Furthermore, the first redistribution layer 230 is applied to redistribute or relocate signals to an arrangement of external devices or input/output connections, which first redistribution layer 230 includes a dielectric layer 232, a plurality of metal layers 234 and a plurality of vias 236. The metal layers 234 are arranged in parallel inside the dielectric layer 232, and the vias 236 are also in the dielectric layer 232, which two adjacent metal layers 234 are electrically connected by the vias 236. Notably, the metal layers 234 are also electrically connected to the conductive pads 222 of the device regions 220 by the vias 236, so as to electrically connect at least two device regions 220 through the conductive pads 222, the vias 236 and the metal layers 234. In addition, the number of the metal layers 234 is predetermined according to design requirement. In some embodiments, the vias 236 and the metal layers 234 are formed of aluminum, copper, or a combination thereof, but are not limited thereto. Other conductive materials are also suitable for the vias 236 and the metal layers 234. In various embodiments, the dielectric layer 232 is formed of silicon oxide, silicon nitride, silicon oxynitride, or a combination thereof, but is not limited thereto. Other insulating materials are also suitable for the dielectric layer 232.

Continuing in FIGS. 2A and 2B, the external chip 240 is disposed on the first redistribution layer 230, and a plurality of first connectors 250 are interposed between the first redistribution layer 230 and the external chip 240 to interconnect the two. As aforementioned, the first redistribution layer 230 is electrically connected to the device regions 220, and the first connectors 250 are disposed on and in contact with the first redistribution layer 230. The external chip 240 is disposed on and in contact with the first connectors 250, so that the external chip 240 is electrically connected to the device regions 220 via the first connectors 250, the first redistribution layer 230 and the conductive pads 222. Therefore, the external chip 240 is able to receive signals from the device regions 220 to perform computing operations.

The difference between the multi-device package 100 and the multi-device package 200 is that the multi-device package 200 does not include second connectors in contact with the first redistribution layer 230. The multi-device package 200 includes the molding layer 260 covering the first redistribution layer 230 and the external chip 240, and the second redistribution layer 270 is disposed on the molding layer 260. The molding layer 260 includes a first conductive contact 262 and a second conductive contact 264. The first conductive contact 262 is through the molding layer 260, and therefore the first conductive contact 262 is in contact with the first redistribution layer 230 and the second redistribution layer 270 to interconnect the two. Furthermore, the second conductive contact 264 extends through the molding layer 260 and the external chip 240, and therefore the second conductive contact 264 is in contact with the first redistribution layer 230 and the second redistribution layer 270 to interconnect the two. In some embodiments, the molding layer 260 is formed of epoxy.

Referring to FIG. 2C to further clarify a structure of the external chip 240, FIG. 2C is a three-dimensional view of an external chip, according to various embodiments of the present disclosure. As shown in FIG. 2C and with continued reference to FIG. 2B, the external chip 240 has a first through hole 242 through the external chip 240, and the second conductive contact 264 passes the molding layer 260 and the first through hole 242 to contact the first redistribution layer 230 under the external chip 240, so as to improve electrical connection between the first redistribution layer 230 and the second redistribution layer 270. Furthermore, wire layout of the first redistribution layer 230 and the second redistribution layer 270 is more flexible, and thus increases efficiency of the process. Notably, the second conductive contact 264 is not in contact with the internal wires of the external chip 240 to avoid connection errors.

The second redistribution layer 270 includes a dielectric layer 272, a plurality of metal layers 274 and a plurality of vias 276. The metal layers 274 are arranged in parallel inside the dielectric layer 272, and the vias 276 are also in the dielectric layer 272, which two adjacent metal layers 274 are electrically connected by the via 276. To be noticed, the metal layers 274 are also electrically connected to the first conductive contact 262 and the second conductive contact 264 by the vias 276. In addition, the number of the metal layers 234 is predetermined according to design requirement.

Continuing in FIGS. 2A and 2B, a plurality of third connectors 280 is disposed on the second redistribution layer 270. The third connectors 280 are in contact with the second redistribution layer 270, so that the computing results generated by the external chip 240 are transmitted to the third connectors 280 via the first connectors 250, the first redistribution layer 230, the first conductive contact 262, the second conductive contact 264 and the second redistribution layer 270. The third connectors 280 further transmit the computing results to other external devices, such as a printed circuit board. In addition, layout of the third connectors 280 is more flexible due to the formation of the second conductive contact 264. In some embodiments, the first connectors 250 and the third connectors 280 may be solder bumps or solder balls formed of tin, but are not limited thereto.

Compared with the multi-device package 100, the third connectors 280 of the multi-device package 200 have similar sizes with the second connectors 160 of the multi-device package 100, but a density of the third connectors 280 is larger than a density of the second connectors 160. Because the third connectors 280 and the external chip 240 are fabricated at different layers, there is more space to place the third connectors 280, and thus increase their density. Therefore, the electrical connection between the multi-device package 200 and the printed circuit board is enhanced due to the higher density of the third connectors 280.

Figure 2D:
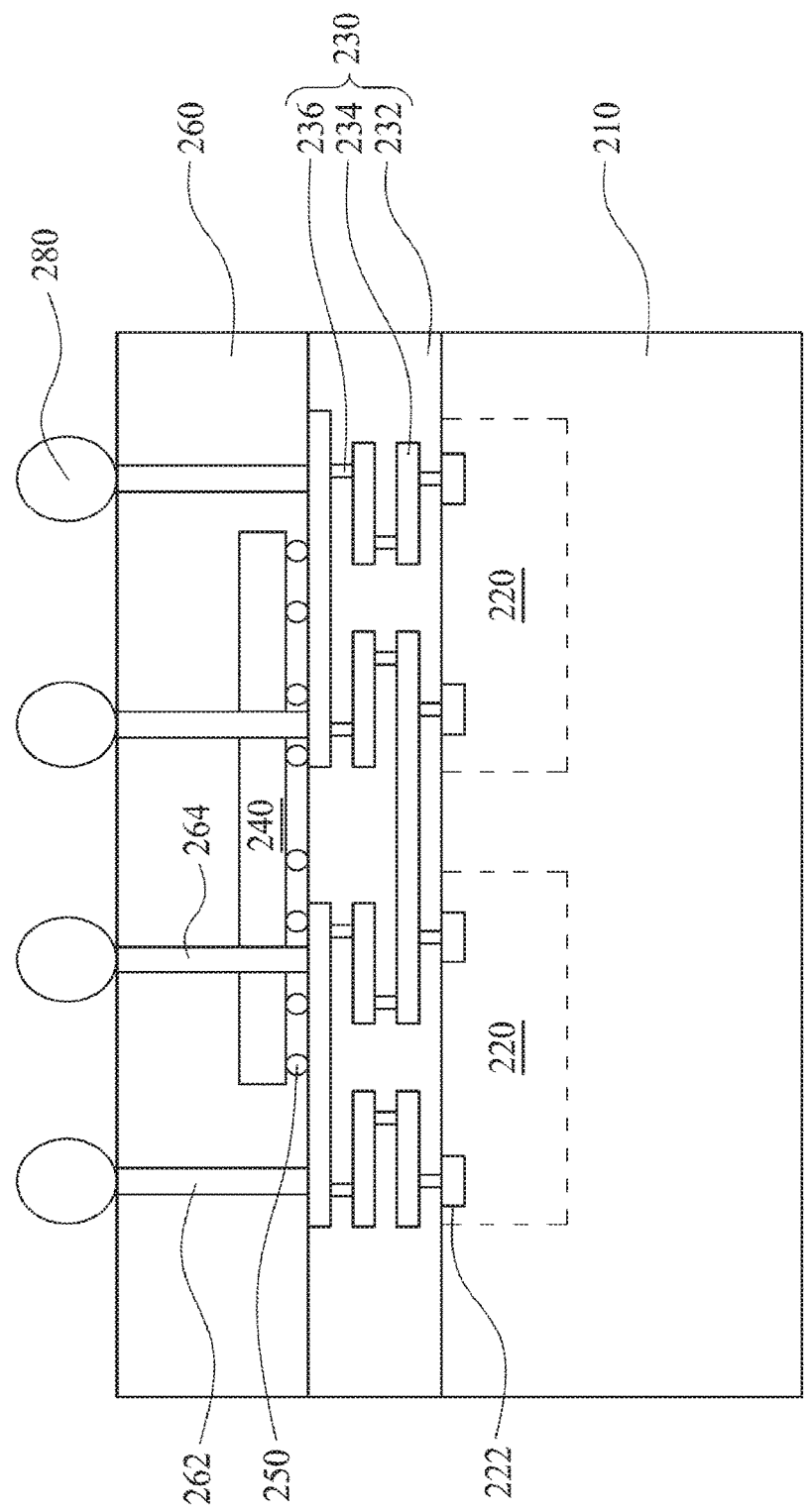
FIG. 2D is a cross-sectional view of a multi-device package, according to various embodiments of the present disclosure.

Referring to FIG. 2D, FIG. 2D is a cross-sectional view of a multi-device package, according to various embodiments of the present disclosure. A multi-device package 200a is illustrated in FIG. 2D, and the difference between the multi-device package 200 (FIGS. 2A and 2B) and the multi-device package 200a is that the second redistribution layer 270 is omitted in the multi-device package 200a, so that the third connectors 280 are disposed directly on the molding layer 260. Specifically, each of the third connectors 280 is on the molding layer 260 and in contact with the first conductive contact 262 or the second conductive contact 264, so that computing results generated by the external chip 240 are transmitted to the third connectors 280 via the first connectors 250, the first redistribution layer 230 and the first conductive contact 262 or the second conductive contact 264. The third connectors 280 further transmit the computing results to other external devices, such as a printed circuit board. It is worth noting that the omitting of the second redistribution layer 270 decreases the thickness of the multi-device package 200a, in addition, density of the third connectors 280 on the molding layer 260 is increased to enhance the electrical connection between the multi-device package 200a and the subsequent printed circuit board.

Please refer to FIGS. 3A to 3D to further clarify a process of manufacturing the multi-device package 100 shown in FIGS. 1A and 1B. FIGS. 3A to 3D are cross-sectional views of the multi-device package in FIG. 1A and FIG. 1B at an intermediate stage of fabrication, in accordance with various embodiments.

Figure 3A:
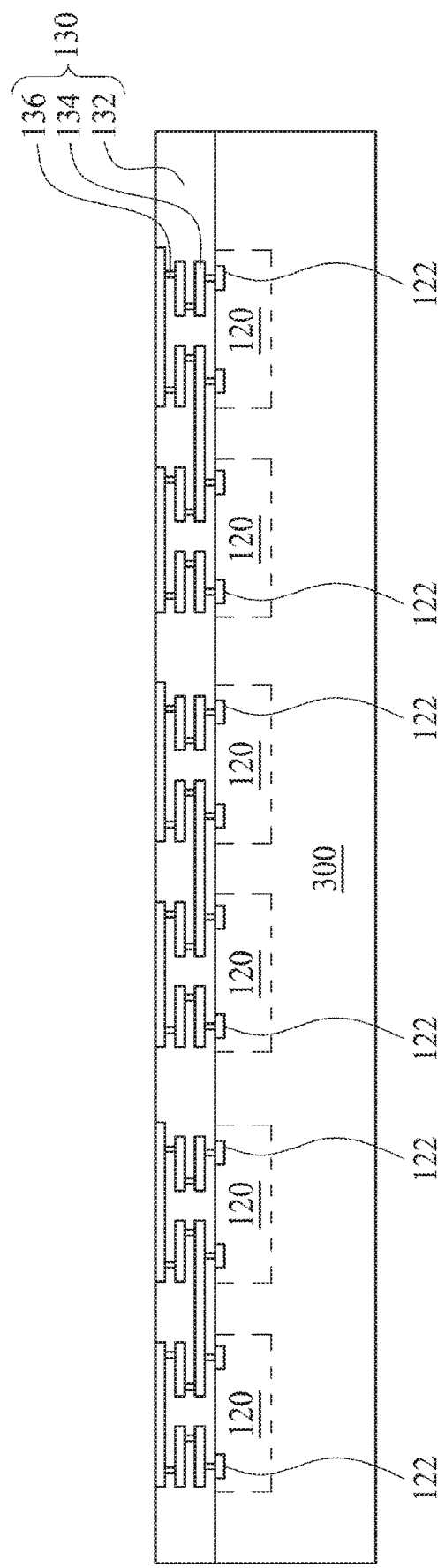
FIGS. 3A to 3D are cross-sectional views of the multi-device package in FIGS. 1A and 1B at an intermediate stage of fabrication, in accordance with various embodiments.

Referring to FIG. 3A, a first redistribution layer 130 is formed on a wafer 300, which has at least two device regions 120, and the first redistribution layer 130 is electrically connected to the two device regions 120. To be noticed, each of the device regions 120 includes a semiconductor device, an inter-layer dielectric (ILD) layer covering the semiconductor device, an inter-metal dielectric (IMD) layer on the ILD layer, and a metal interconnect structure disposed in the IMD layer and electrically connected to the semiconductor device. In addition, each of the device regions 120 has a conductive pad 122, which is an uppermost metal layer of the metal interconnect structure. The first redistribution layer 130 is formed by the following steps. First, a dielectric material is deposited to cover the wafer 300, and a photolithography etching process is performed to remove a portion of the dielectric material. Therefore, openings are formed to expose the device regions 120 of the wafer 300. Specifically, each of the openings correspond to one conductive pad 122 of the device regions 120. Then, vias 136 are respectively formed in these openings, and a metal layer 134 is formed on the vias. The metal layer 134 is patterned according to layout design, so as to electrically connect at least two device regions 120. The steps mentioned above are repeated a few times to obtain the first redistribution layer 130 having a plurality of metal layers 134 inside a dielectric layer 132, and the number of the metal layers 134 is predetermined according to design requirement.

Figure 3B:
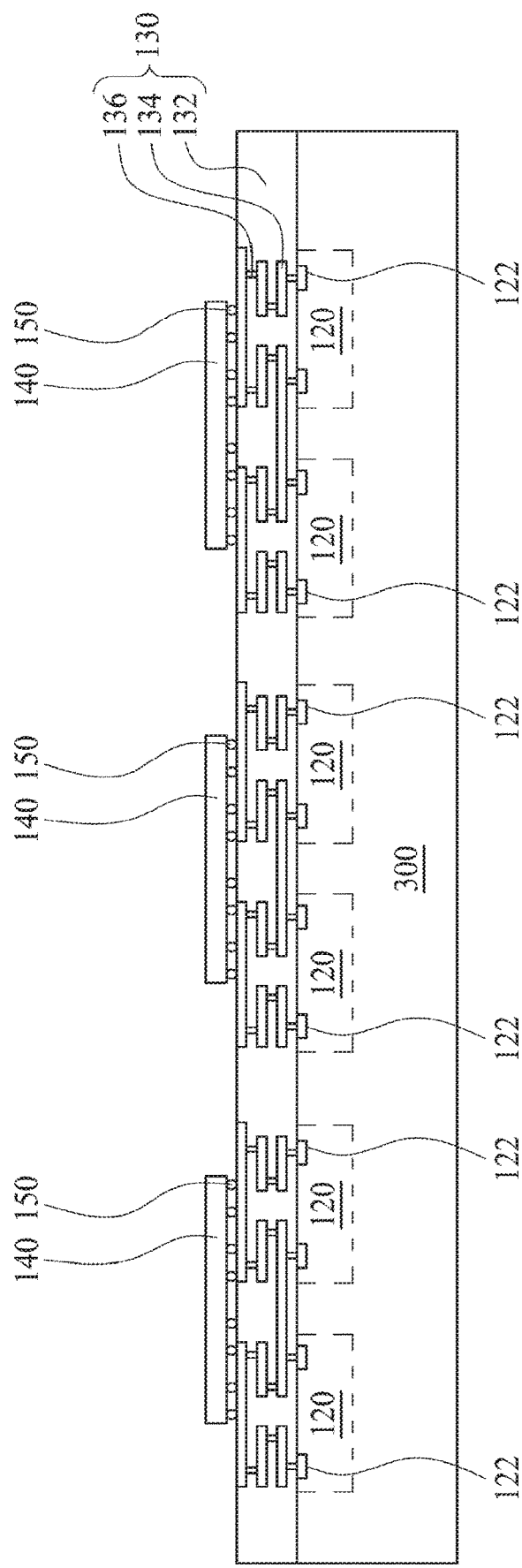

Referring to FIG. 3B, a plurality of first connectors 150 is formed on the first redistribution layer 130, and an external chip 140 is mounted on the first connectors 150. A reflow process is performed to form the first connectors 150 on the first redistribution layer 130, and the external chip 140 is formed to contact the first connectors 150. Thus, the external chip 140 is electrically connected to the device regions 120 via the first connectors 150, the first redistribution layer 130 and the conductive pads 122, so the external chip 140 is able to receive signals from the device regions 120 to perform computing operations.

Figure 3C:
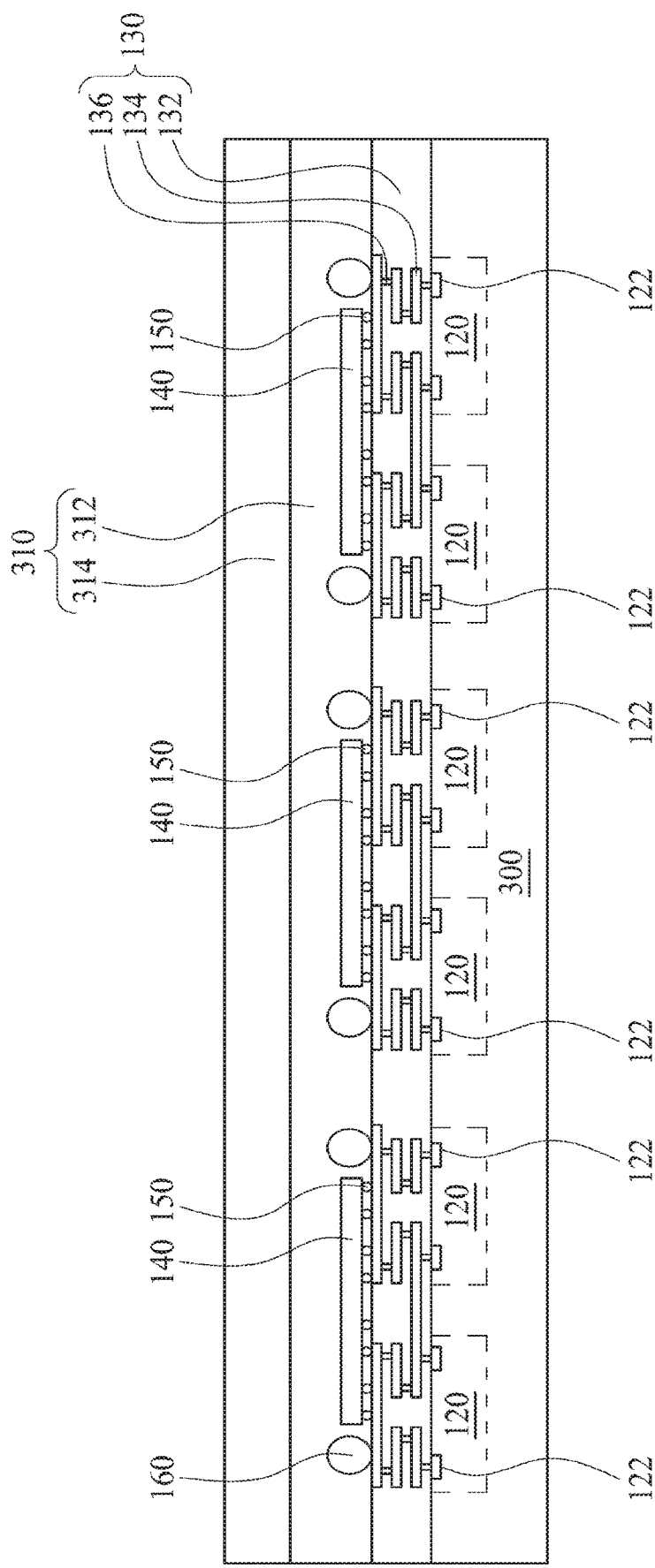

Continuing in FIG. 3C, a plurality of second connectors 160 is formed on the first redistribution layer 130, and a temporary adhesive layer 310 is formed to cover the second connectors 160 and the external chip 140. A reflow process is performed to form the second connectors 160 on the first redistribution layer 130, and a diameter of the second connector 160 is larger than a sum of a diameter of the first connector 150 and a thickness of the external chip 140, so as to ensure the external chip 140 will not contact the printed circuit board formed in a subsequent process. After forming the second connectors 160, the temporary adhesive layer 310 is formed, and the wafer 300 is thinned to reduce its thickness, so as to decrease the size of the subsequent multi-device package. The temporary adhesive layer 310 includes a carrier 314 and an adhesive layer 312, which temporary adhesive layer 310 reduces the stress from the thinning process. Therefore, risk of wafer fracture is decreased. In some embodiments, the temporary adhesive layer 310 is a tape. In some embodiments, the wafer 300 is thinned by a chemical-mechanical polishing process.

Figure 3D:
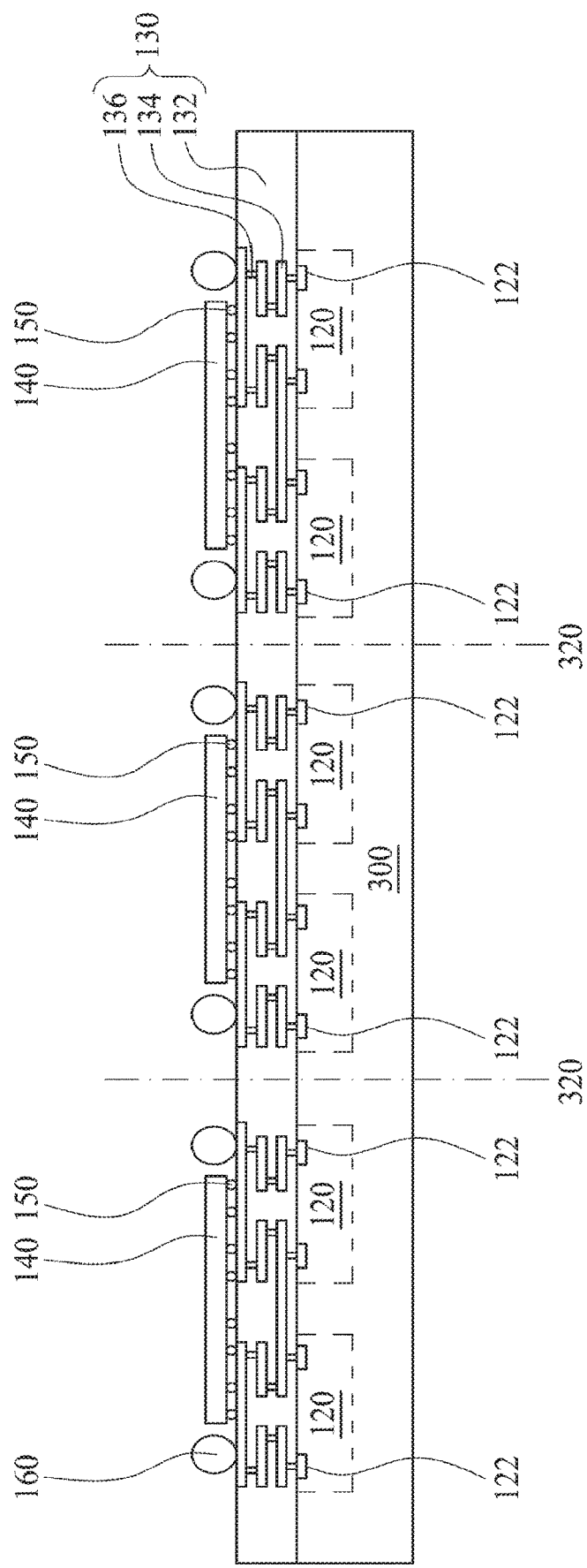

Continuing in FIG. 3D, the temporary adhesive layer 310 is removed, and the wafer 300 is diced along a scribe line 320 to form the multi-device package shown 100 in FIGS. 1A and 1B. A suitable solvent is applied to eliminate the adhesive property of the adhesive layer 312 to separate the temporary adhesive layer 310 from the wafer 300. Then, the wafer 300 is diced along the scribe line 320 to form individual multi-device packages 100. To be noticed, the scribe line 320 does not pass the metal layers 134 of the first redistribution layer 130 to avoid the line disconnection of the first redistribution layer 130. In some embodiments, the wafer 300 is diced along the scribe line 320 before removing the temporary adhesive layer 310. In various embodiments, the multi-device package 100 is further connected to the printed circuit board by the second connectors 160, and computing results generated by the external chip 140 are transmitted to the printed circuit board via the first connectors 150, the first redistribution layer 130 and the second connectors 160.

Please refer to FIGS. 4A to 4F to further clarify a process of manufacturing the multi-device package 200 shown in FIGS. 2A and 2B. FIGS. 4A to 4F are cross-sectional views of the multi-device package in FIGS. 2A and 2B at an intermediate stage of fabrication, in accordance with various embodiments.

Figure 4A:
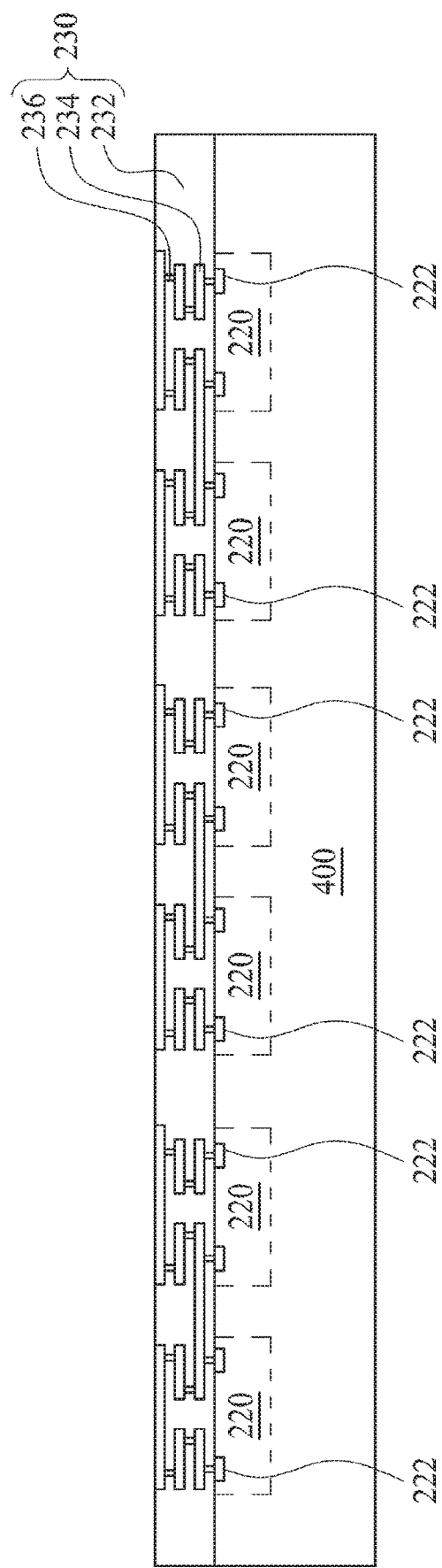
FIGS. 4A to 4F are cross-sectional views of the multi-device package in FIGS. 2A and 2B at an intermediate stage of fabrication, in accordance with various embodiments.

Referring to FIG. 4A, a first redistribution layer 230 is formed on a wafer 400, which has at least two device regions 220, and the first redistribution layer 230 is electrically connected to the two device regions 220. To be noticed, each of the device regions 220 includes a semiconductor device, an inter-layer dielectric (ILD) layer covering the semiconductor device, an inter-metal dielectric (IMD) layer on the ILD layer, and a metal interconnect structure disposed in the 1 MB layer and electrically connected to the semiconductor device. In addition, each of the device regions 220 has a conductive pad 222, which is the uppermost metal layer of the metal interconnect structure. The steps of forming the first redistribution layer 230 is same as the steps of forming the first redistribution layer 130, and the details are not described herein.

Figure 4B:
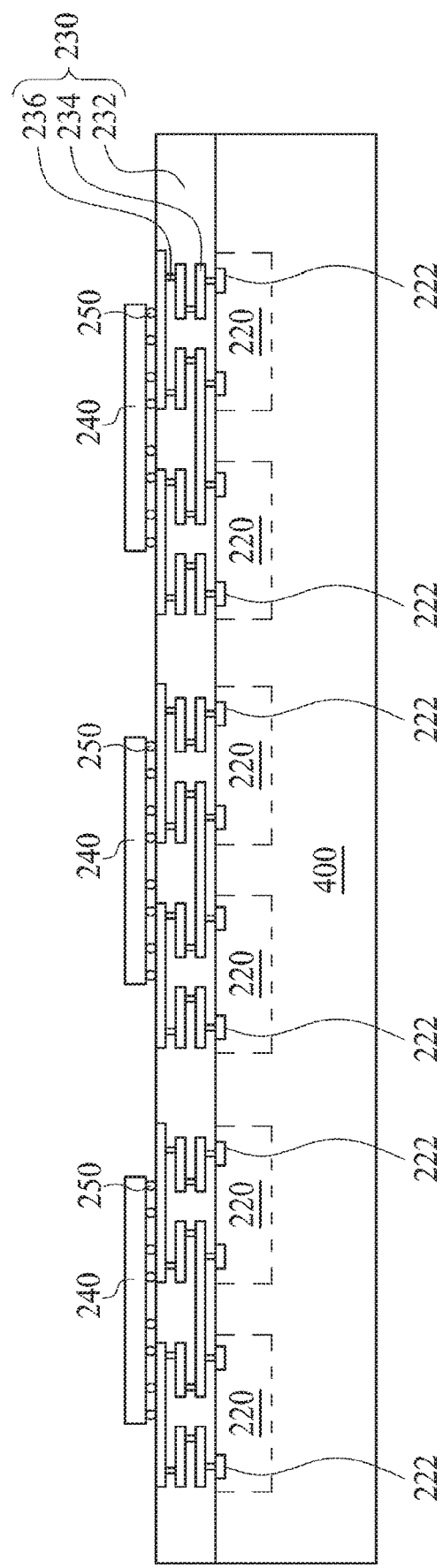

Referring to FIG. 4B, a plurality of first connectors 250 is formed on the first redistribution layer 230, and an external chip 240 is mounted on the first connectors 250. A reflow process is performed to form the first connectors 250 on the first redistribution layer 230, and the external chip 240 is formed to contact the first connectors 250. Thus, the external chip 240 is electrically connected to the device regions 220 via the first connectors 250, the first redistribution layer 230 and the conductive pads 222, so the external chip 240 is able to receive signals from the device regions 120 to perform computing operations.

Figure 4C:
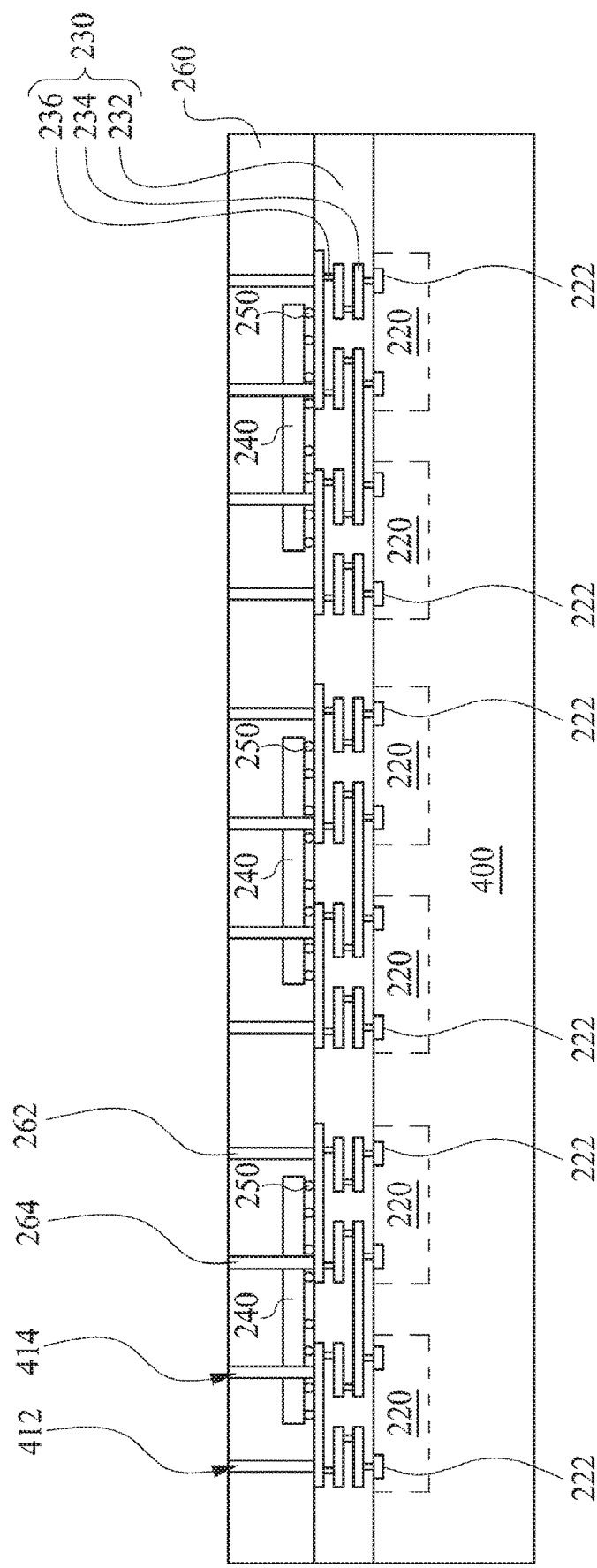

Continuing in FIG. 4C, a molding layer 260 is formed to cover the first redistribution layer 230 and the external chip 240, and a portion of the molding layer 260 is removed to form a second through hole 412 and a third through hole 414. The second through hole 412 exposes the first distribution layer 230, and the third through hole 414 is through the first through hole 242 (FIG. 2C) of the external chip 240 to expose the first redistribution layer 230. The molding layer 260 is formed by coating or spraying epoxy, and a photolithography etching process is performed to remove a portion of the molding layer 260, so as to form the second through hole 412 and the third through hole 414. As aforementioned in FIG. 2C, the external chip 240 has the first through hole 242, and the third through hole 414 is substantially aligned with the first through hole 242 to expose the first redistribution layer 230 under the external chip 240. Furthermore, the second through hole 412 is through the molding layer 260 to expose the first redistribution layer 230. Then, a conductive material is filled in the first through hole 242, the second through hole 412 and the third through hole 414 to form a first conductive contact 262 and a second conductive contact 264. In some embodiments, the first conductive contact 262 and the second conductive contact 264 are formed of copper, aluminum, or a combination thereof, but are not limited thereto.

Figure 4D:
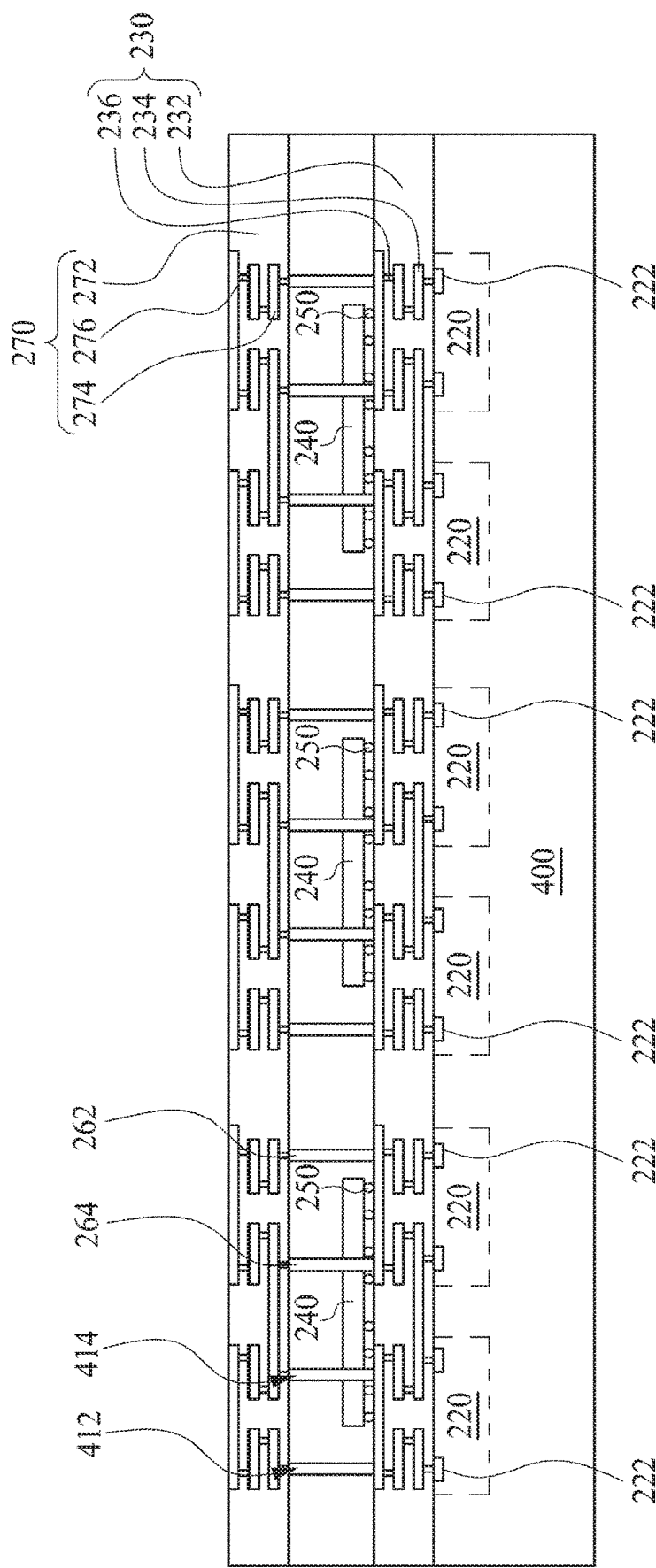

Referring to FIG. 4D, a second redistribution layer 270 is formed on the molding layer 260. The second redistribution layer 270 is formed by the following steps. First, a dielectric material is deposited to cover the molding layer 260, and a photolithography etching process is performed to remove a portion of the dielectric material. Therefore, openings are formed, and each of the openings corresponds to the first conductive contact 262 or the second conductive contact 264. Then, vias 276 are respectively formed in the openings, and a metal layer 274 is formed on the vias 276. The metal layer 274 is patterned according to a layout design. The steps mentioned above are repeated a few times to obtain the second redistribution layer 270 having a plurality of metal layers 274 inside a dielectric layer 272, and the number of the metal layers 274 is predetermined according to design requirements.

Figure 4E:
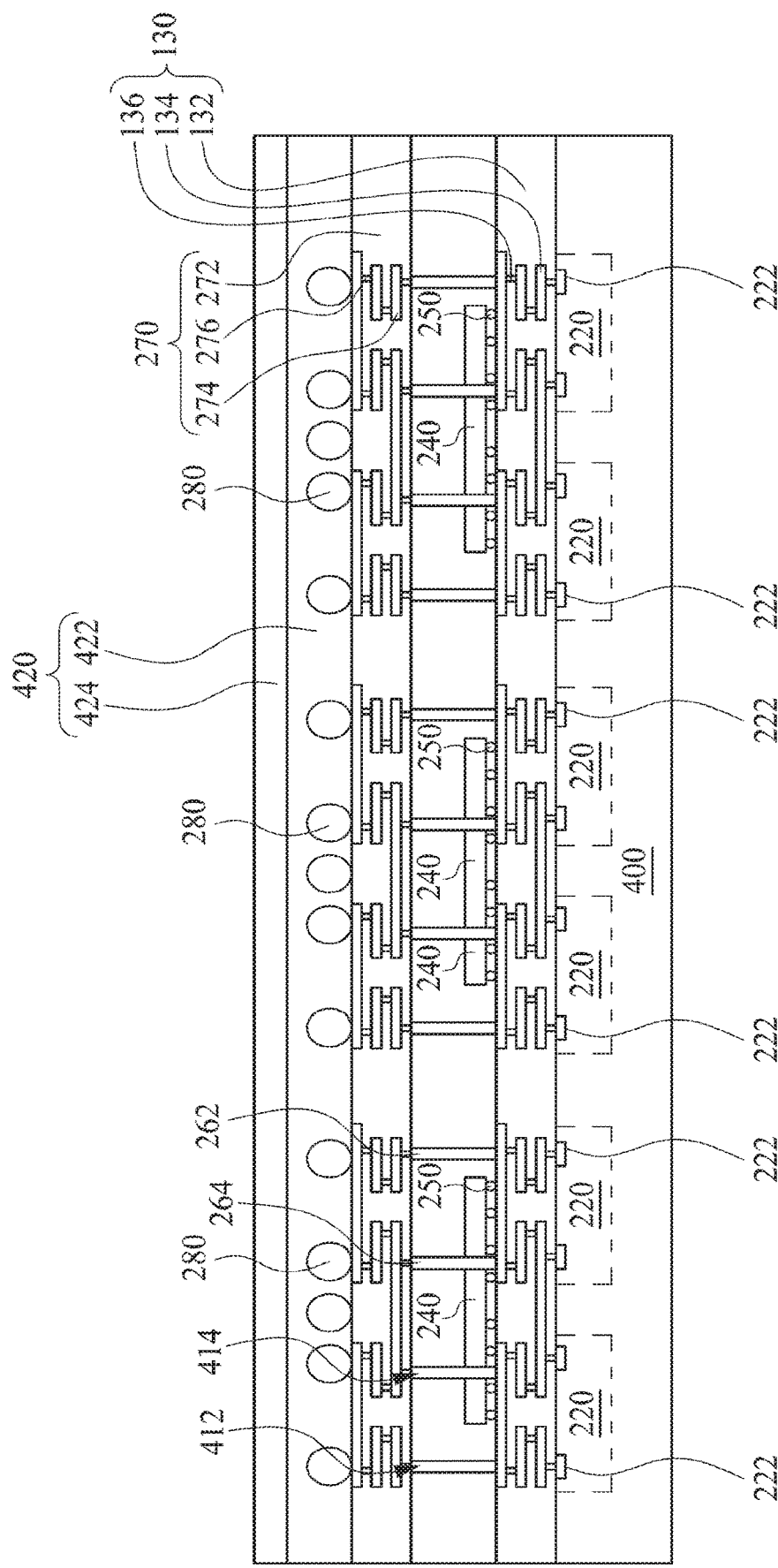

Continuing in FIG. 4E, a plurality of third connectors 280 is formed on the second redistribution layer 270, and a temporary adhesive layer 420 is formed to cover the third connectors 280 and the second redistribution layer 270. A reflow process is performed to form the third connectors 280 on the second redistribution layer 270. After forming the third connectors 280, the temporary adhesive layer 420 is formed, and the wafer 400 is thinned to reduce its thickness, so as to decrease the size of a subsequent multi-device package. The temporary adhesive layer 420 includes a carrier 424 and an adhesive layer 422, which temporary adhesive layer 420 reduces the stress from the thinning process. Therefore, risk of wafer fracture is decreased. In some embodiments, the temporary adhesive layer 420 is a tape. In some embodiments, the wafer 400 is thinned by a chemical-mechanical polishing process.

Figure 4F:
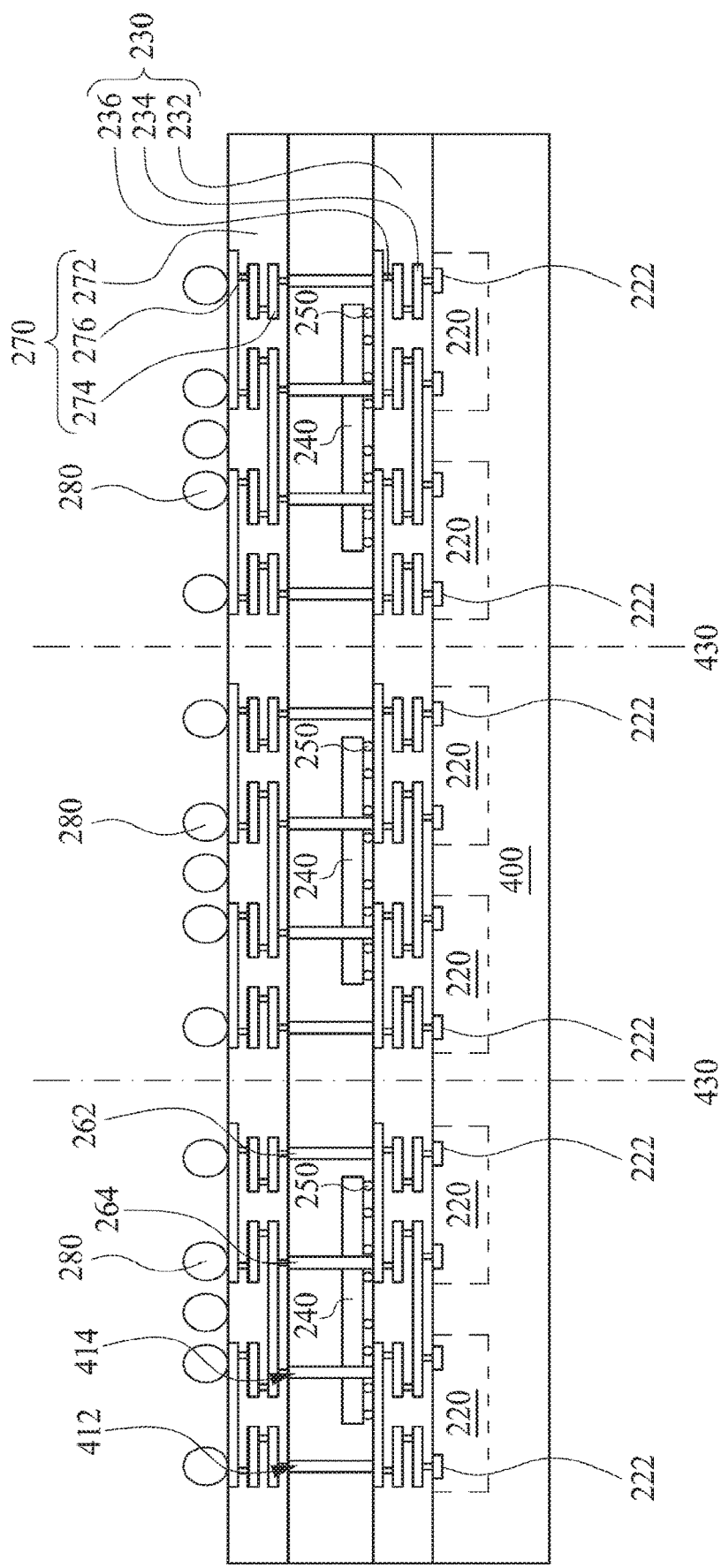

Continuing in FIG. 4F, the temporary adhesive layer 420 is removed, and the wafer 400 is diced along a scribe line 430 to form the multi-device package 200 shown in FIGS. 2A and 2B. A suitable solvent is applied to eliminate the adhesive property of the adhesive layer 422 to separate temporary adhesive layer 420 from the wafer 400. Then, the wafer 400 is diced along the scribe line 430 to form individual multi-device packages 200. To be noticed, the scribe line 430 does not pass the metal layers 234 of the first redistribution layer 230 and the metal layers 274 of the second redistribution layer 270 to avoid line disconnection of the first redistribution layer 230 and the second redistribution layer 270. In some embodiments, the wafer 400 is diced along the scribe line 430 before removing the temporary adhesive layer 420. In various embodiments, the multi-device package 200 is further connected to the printed circuit board by the third connectors 280, and computing results generated by the external chip 240 are transmitted to the printed circuit board via the first connectors 250, the first redistribution layer 230, the first and second conductive contacts 262 and 264, the second redistribution layer 270 and the third connectors 280.

Figure 5:
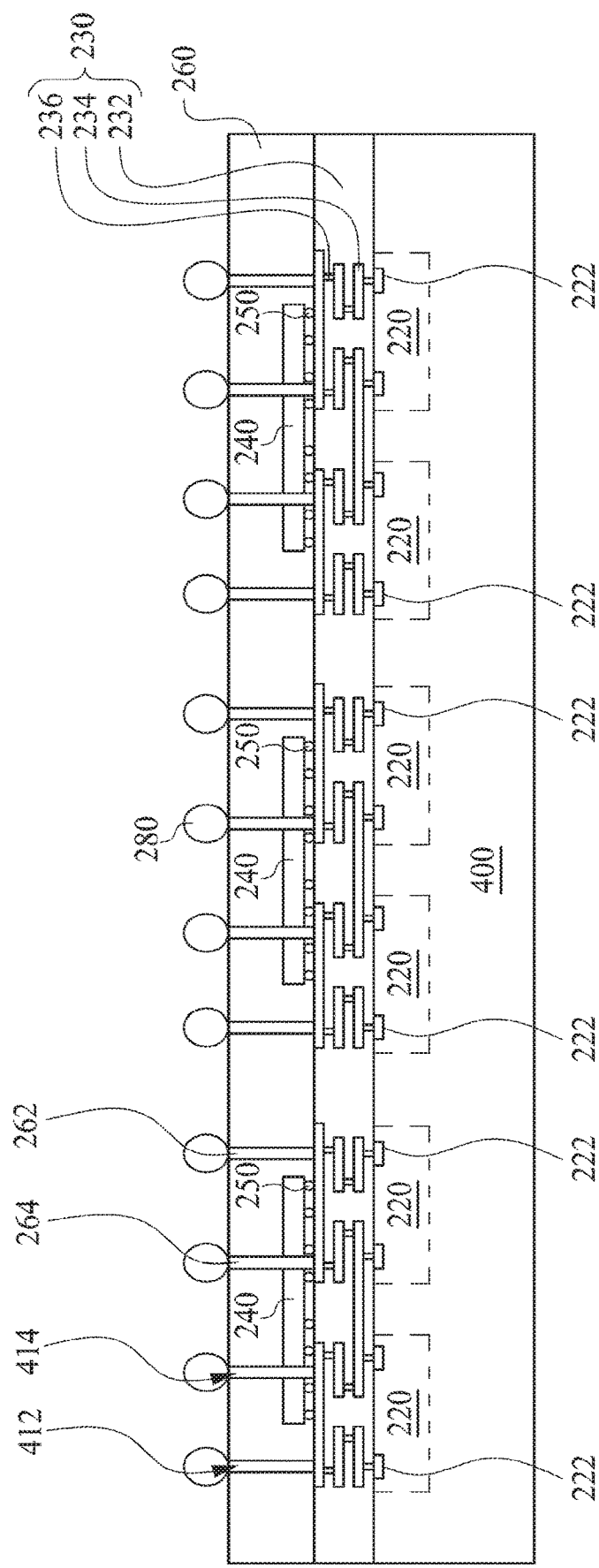
FIG. 5 is a cross-sectional view of the multi-device package in FIG. 2D at an intermediate stage of fabrication, in accordance with various embodiments.

Referring to FIG. 5, FIG. 5 is a cross-sectional view of the multi-device package in FIG. 2D at an intermediate stage of fabrication, in accordance with various embodiments. Specifically, FIG. 5 is a cross-sectional view in the next stage after FIG. 4C during manufacturing the multi-device packages 200a. After forming the first and second conductive contacts 262 and 264 in the molding layer 260, a reflow process is performed to form the third connectors 280 on the molding layer 260. To be noticed, each of the third connectors 280 is in contact with the first conductive contact 262 or the second conductive contact 264, so as to be electrically connected to the external chip 240. Then, a thinning process and a dicing process similar to FIGS. 4E and 4F are performed to reduce the thickness of the wafer 400 and to dice the wafer 400 into individual multi-device packages 200a shown in FIG. 2D, the details are not described herein.

The embodiments of the present disclosure discussed above have advantages over existing packages and processes, and the advantages are summarized below. The present disclosure provides a wafer-level packaging process, which is applied to integrate at least two device regions into one multi-device package without using a carrier substrate, and, therefore, the substrate and the device regions of the multi-device package have no interface therebetween. Furthermore, the device regions in the wafer are integrated directly, so as to decrease risk of disconnection and fracture in the device regions. To summarize, the costs of the multi-device package are decreased due to an omission of the carrier substrate, and the efficiency of the packaging process is increased to enhance the yield of the multi-device package.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A multi-device package, comprising:
   at least two device regions located within and comprising material of a wafer, the at least two device regions being laterally separated from one another within a common wafer;
   conductive pads recessed within the wafer;
   a first redistribution layer located directly on an upper surface of the wafer and electrically connected to the at least two device regions through the conductive pads, the at least two device regions being electrically integrated with one another through the first redistribution layer, wherein the conductive pads comprise an uppermost metal material of a metal interconnect structure of the first redistribution layer;
   an external chip located on the first redistribution layer; and
   first connectors located between the first redistribution layer and the external chip to interconnect the first redistribution layer and the external chip.

2. The multi-device package of claim 1, further comprising second connectors located on the first redistribution layer.

3. The multi-device package of claim 2, wherein a diameter of the second connectors is larger than a sum of a diameter of a first connector of the first connectors and a thickness of the external chip.

4. The multi-device package of claim 1, further comprising:
   a molding material covering the external chip and the first redistribution layer;
   a second redistribution layer located on the molding material; and
   third connectors located on the second redistribution layer.

5. The multi-device package of claim 4, wherein the molding material comprises a first conductive contact through the molding material to interconnect the first redistribution layer and the second redistribution layer.

6. The multi-device package of claim 5, wherein the molding material comprises a second conductive contact through the molding material and the external chip to interconnect the first redistribution layer and the second redistribution layer.

7. The multi-device package of claim 4, wherein each of the first redistribution layer and the second redistribution layer comprises:
   at least two adjacent regions of metal material arranged in parallel inside a dielectric material; and
   conductive columns, the at least two adjacent regions of metal material being electrically connected by the conductive columns.

8. The multi-device package of claim 4, wherein the molding material comprises an epoxy.

9. A multi-device package, comprising:
at least two device regions located within and comprising material of a wafer, the at least two device regions being laterally separated from one another within a common wafer;
a first redistribution layer located directly on an upper surface of the wafer, the first redistribution layer electrically integrating the at least two device regions;
an external chip located on the first redistribution layer;
a second redistribution layer located over the first redistribution layer; and
a molding material located between the first redistribution layer and the second redistribution layer, the molding material comprising:
a first conductive contact through the molding material; and
a second conductive contact through the molding material and through openings within the external chip, and the first conductive contact and the second conductive contact interconnecting the first redistribution layer and the second redistribution layer.

10. The multi-device package of claim 9, wherein the at least two device regions comprise four device regions comprising material of the wafer with no interface between each of the four device regions and the wafer.

11. The multi-device package of claim 9, further comprising conductive pads recessed within the wafer in the at least two device regions, the conductive pads comprising an uppermost metal material of a metal interconnect structure of the first redistribution layer.

12. A microelectronic device, comprising:
a wafer comprising conductive pads recessed within the wafer;
at least two device regions located within the wafer, the at least two device regions comprising material of the wafer and being laterally separated from one another within the same wafer;
a first redistribution layer located directly on an upper surface of the wafer, the first redistribution layer electrically connected to the at least two device regions to electrically integrate the at least two device regions, wherein the conductive pads comprise an uppermost metal material of a metal interconnect structure of the first redistribution layer;
first connectors located on the first redistribution layer;
an external chip located on the first connectors, the external chip electrically connected to the first redistribution layer with the first connectors.

13. The microelectronic device of claim 12, further comprising second connectors located on the first redistribution layer, the second connectors surrounding the external chip on at least three sides, wherein at least some of the second connectors are located in vertical alignment with the at least two device regions.

14. The microelectronic device of claim 12, further comprising:
a molding material located over the first redistribution layer and the external chip; and
a second redistribution layer located over the molding material.

15. The microelectronic device of claim 14, further comprising conductive contacts extending vertically through the molding material, wherein the conductive contacts electrically connect the first redistribution layer and the second redistribution layer.

16. The microelectronic device of claim 15, wherein at least some of the conductive contacts extend through openings in the external chip.

17. The microelectronic device of claim 15, further comprising third connectors located on the second redistribution layer, wherein the third connectors are in communication with the external chip through the second redistribution layer, the conductive contacts, the first redistribution layer, and the first connectors.

18. The microelectronic device of claim 12, further comprising:
a molding compound located over the first redistribution layer and the external chip;
first conductive contacts extending vertically through the molding compound; and
second conductive contacts extending through the molding compound and the external chip.

19. The microelectronic device of claim 18, further comprising fourth connectors located on the molding compound, wherein the fourth connectors are in direct physical contact with the first conductive contacts and the second conductive contacts.

20. The microelectronic device of claim 19, wherein the fourth connectors are in communication with the external chip through the first connectors, the first redistribution layer, and at least one of the first conductive contacts or the second conductive contacts.

21. The multi-device package of claim 1, wherein at least two conductive pads are recessed with each device region of the at least two device regions.

22. The multi-device package of claim 10, wherein the four device regions are positioned in a square configuration with the external chip being in vertical alignment with at least a portion of each of the four device regions.

* * * * *

UNITED STATES PATENT AND TRADEMARK OFFICE
CERTIFICATE OF CORRECTION

PATENT NO. : 10,593,637 B2
APPLICATION NO. : 16/108473
DATED : March 17, 2020
INVENTOR(S) : Shih-Fan Kuan and Yi-Jen Lo It is certified that error appears in the above-identified patent and that said Letters Patent is hereby corrected as shown below:

In the Specification
Column 4,    Line 47,        change "the 1 MB layer" to --the IMD layer--
Column 6,    Line 19, 20,    change "the 1 MB layer" to --the IMD layer--
Column 10,   Line 6,         change "1 MB layer" to --IMD layer--

Signed and Sealed this
Fifth Day of May, 2020

Andrei Iancu
*Director of the United States Patent and Trademark Office*